US011316618B2

(12) United States Patent
Park et al.

(10) Patent No.: US 11,316,618 B2
(45) Date of Patent: Apr. 26, 2022

(54) PBCH SIGNAL ACCUMULATION METHOD AND PBCH DECODER FOR ENHANCING PERFORMANCE OF 5G NR RECEIVER

(71) Applicant: GCT Research, Inc., Seoul (KR)

(72) Inventors: Tae Won Park, Dangjin-si (KR); Ji Ho Jang, Seoul (KR); In Seok Hwang, Seoul (KR)

(73) Assignee: GCT Research, Inc., Seoul (KR)

( * ) Notice: Subject to any disclaimer, the term of this patent is extended or adjusted under 35 U.S.C. 154(b) by 203 days.

(21) Appl. No.: 16/729,597

(22) Filed: Dec. 30, 2019

(65) Prior Publication Data

US 2020/0220662 A1 Jul. 9, 2020

(30) Foreign Application Priority Data

Jan. 4, 2019 (KR) .................. 10-2019-0001128

(51) Int. Cl.
| | |
|---|---|
| H04L 1/16 | (2006.01) |
| H04W 72/00 | (2009.01) |
| H04W 72/04 | (2009.01) |
| H04W 56/00 | (2009.01) |
| H03M 13/09 | (2006.01) |
| H04L 1/00 | (2006.01) |
| H03M 13/13 | (2006.01) |

(52) U.S. Cl.
CPC .......... *H04L 1/1642* (2013.01); *H03M 13/09* (2013.01); *H03M 13/13* (2013.01); *H04L 1/0061* (2013.01); *H04W 56/001* (2013.01); *H04W 72/005* (2013.01); *H04W 72/0446* (2013.01); *H04W 72/0466* (2013.01)

(58) Field of Classification Search
CPC ... H04L 1/1642; H04L 1/0061; H04L 1/0045; H04L 1/0057; H04L 1/0072; H04L 1/0011; H04L 1/0036; H04L 1/0083; H04L 25/03866; H04L 27/34; H04W 72/005; H04W 72/0446; H04W 56/001; H04W 72/0466; H03M 13/09; H03M 13/13; H03M 13/37; H03M 13/6356
See application file for complete search history.

(56) References Cited

U.S. PATENT DOCUMENTS

| | | | |
|---|---|---|---|
| 10,244,426 | B2 | 3/2019 | Xu et al. |
| 2016/0227583 | A1 | 8/2016 | Chavva et al. |
| 2016/0242211 | A1 | 8/2016 | Chung et al. |
| 2018/0198555 | A1* | 7/2018 | Wu ................... H04L 1/0057 |
| 2018/0241416 | A1* | 8/2018 | Axmon ............. H03M 13/093 |

FOREIGN PATENT DOCUMENTS

| | | |
|---|---|---|
| KR | 10-2015-0095004 | 8/2015 |
| KR | 1020170044648 | 4/2017 |

* cited by examiner

*Primary Examiner* — Walter J Divito (57) ABSTRACT

The present invention relates to a method of accumulating and decoding a PBCH signal received by a 5G NR receiver, the method including: generating an inversion vector for negating at least one bit of a system frame number (SFN) included the received PBCH signal; performing accumulation over at least one frame by performing modulo addition on the generated inversion vector and the received PBCH signal; decoding the accumulated PBCH signals; and checking validity of the decode PBCH and reconstructing the SFN.

10 Claims, 10 Drawing Sheets

| | SFN #0 | SFN #2 | SFN #4 | SFN #6 | SFN #8 | SFN #10 | SFN #12 | SFN #14 |
|---|---|---|---|---|---|---|---|---|
| Candidate 0 — Assumption about reception starting from 0 | Inversion 0 | Inversion 2 | Inversion 4 | Inversion 6 | Inversion 8 | Inversion 10 | Inversion 12 | Inversion 14 |
| Inverted SFN | 0 | 0 | 0 | 0 | 0 | 0 | 0 | 0 |
| Candidate 1 — Assumption about reception starting from 2 | Inversion 2 | Inversion 4 | Inversion 6 | Inversion 8 | Inversion 10 | Inversion 12 | Inversion 14 | Inversion 0 |
| Inverted SFN | 2 | 0 | 2 | 0 | 2 | 0 | 2 | 0 |
| Candidate 2 — Assumption about reception starting from 4 | Inversion 4 | Inversion 6 | Inversion 8 | Inversion 10 | Inversion 12 | Inversion 14 | Inversion 0 | Inversion 2 |
| Inverted SFN | 4 | 6 | 12 | 14 | 4 | 6 | 12 | 14 |
| Candidate 3 — Assumption about reception starting from 6 | Inversion 6 | Inversion 8 | Inversion 10 | Inversion 12 | Inversion 14 | Inversion 0 | Inversion 2 | Inversion 4 |
| Inverted SFN | 6 | 4 | 10 | 8 | 6 | 4 | 10 | 8 |
| Candidate 4 — Assumption about reception starting from 8 | Inversion 8 | Inversion 10 | Inversion 12 | Inversion 14 | Inversion 0 | Inversion 2 | Inversion 4 | Inversion 6 |
| Inverted SFN | 8 | 10 | 8 | 10 | 8 | 10 | 8 | 10 |
| Candidate 5 — Assumption about reception starting from 10 | Inversion 10 | Inversion 12 | Inversion 14 | Inversion 0 | Inversion 2 | Inversion 4 | Inversion 6 | Inversion 8 |
| Inverted SFN | 10 | 14 | 10 | 14 | 10 | 14 | 10 | 14 |
| Candidate 6 — Assumption about reception starting from 12 | Inversion 12 | Inversion 14 | Inversion 0 | Inversion 2 | Inversion 4 | Inversion 6 | Inversion 8 | Inversion 10 |
| Inverted SFN | 12 | 12 | 4 | 4 | 12 | 12 | 4 | 4 |
| Candidate 7 — Assumption about reception starting from 14 | Inversion 14 | Inversion 0 | Inversion 2 | Inversion 4 | Inversion 6 | Inversion 8 | Inversion 10 | Inversion 12 |
| Inverted SFN | 14 | 2 | 6 | 2 | 14 | 2 | 6 | 2 |

□ First accumulation section for each candidate
▨ Second accumulation section for each candidate

Fig. 10

PBCH SIGNAL ACCUMULATION METHOD AND PBCH DECODER FOR ENHANCING PERFORMANCE OF 5G NR RECEIVER

CROSS REFERENCE TO RELATED APPLICATION

This application claims priority under 35 U.S.C. §119 to Korean Patent Application No. 10-2019-0001128, filed Jan. 4, 2019, the disclosure of which is incorporated by reference in its entirety.

BACKGROUND OF THE INVENTION

Field of the Invention

The present invention relates to a method for enhancing a reception performance of a 5G NR receiver by effectively accumulating PBCH signals received in a 5G NR communication system, and to a PBCH decoder using the method.

Description of the Related Art

Figure 1:
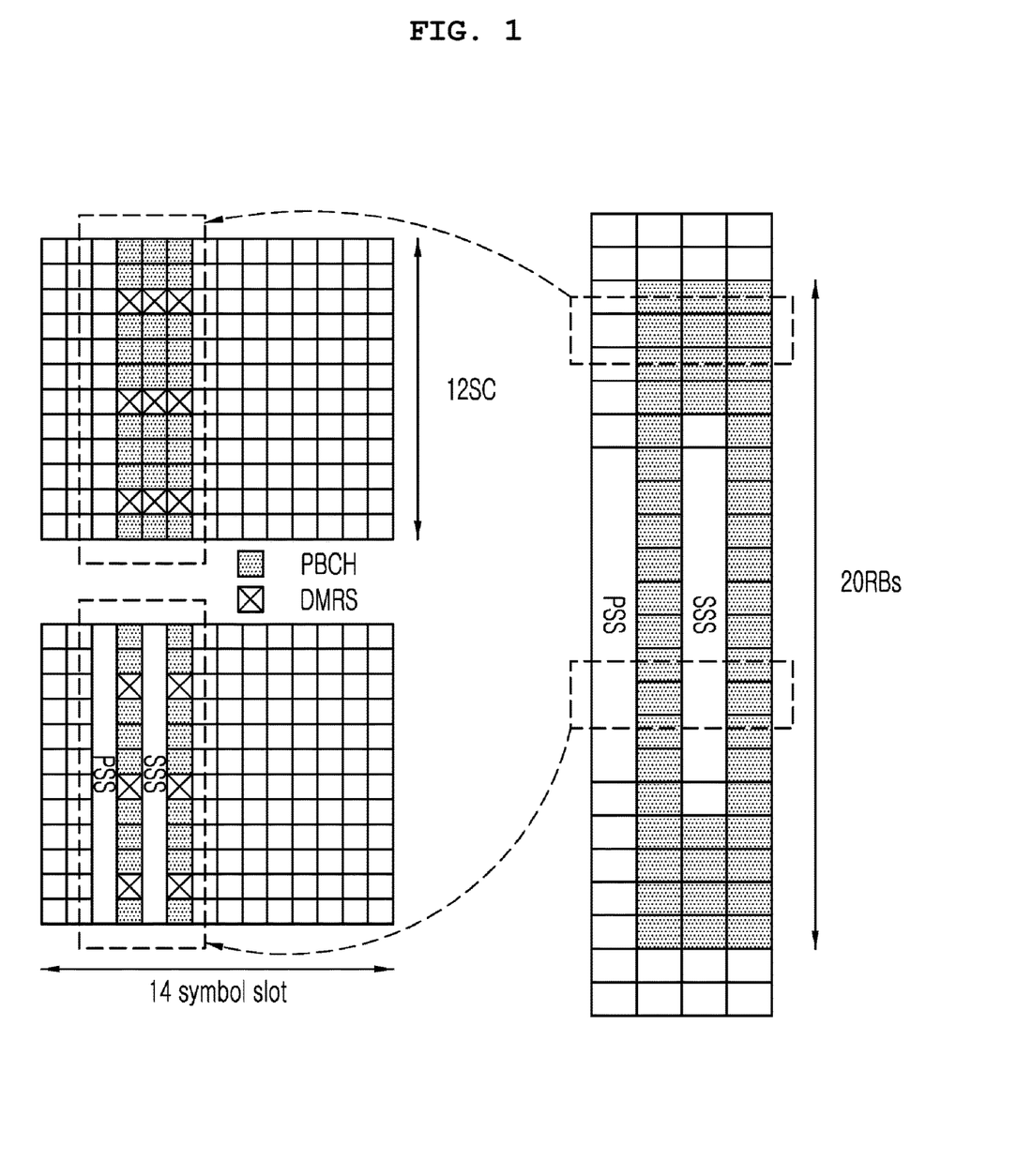
FIG. 1 is a diagram illustrating that a PSS, a SSS, a PBCH, and a demodulation reference signal (DMRS) constitute an SSB block, in a system according to a 5G NR standard.
Figure 2:
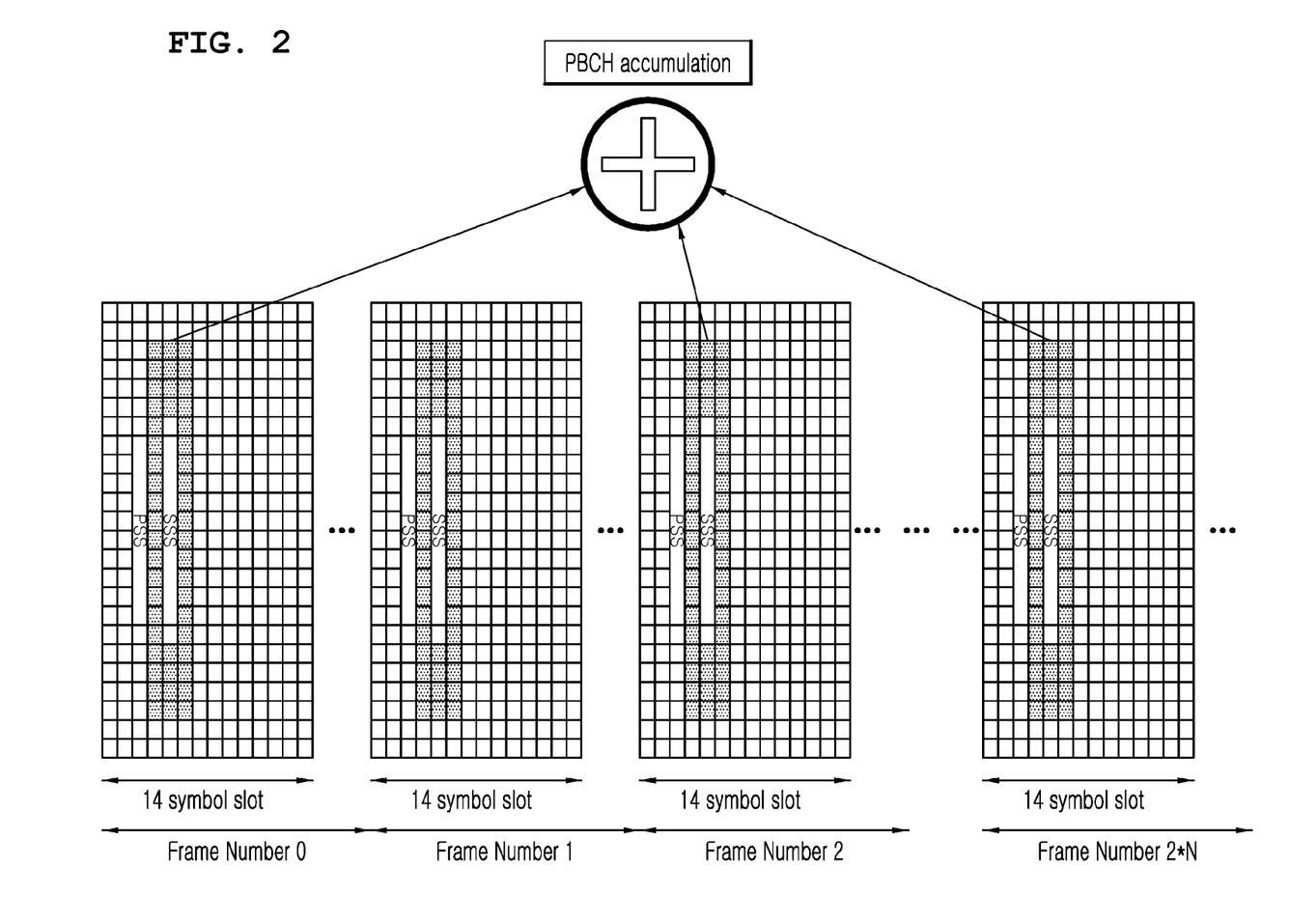
FIG. 2 is a diagram illustrating, in a system according to a 5G NR standard, SSB blocks transmitted periodically and accumulated over frames, wherein the SSB block is transmitted every frame, but in an initial access step, assuming periodicity of two frames, PBCH signals are received and accumulated every two frames.

In a 5G New Radio (NR) wireless communication system, basic information of a cell is obtained through reception of a master information block (MIB) transmitted over a physical broadcasting channel (PBCH). Referring to FIG. 1, a PBCH signal, a primary synchronization signal (PSS), and a secondary synchronization signal (SSS) constitute a SS/PBCH block (SSB block), and the PBCH signal needs to be received "first" to obtain the basic information of the cell which includes a cell ID. When a receiver is located at the edge of the cell, the signal-to-noise ratio (SNR) of the signal is lowered, so the reception performance is degraded. Meanwhile, regarding synchronization signals such as the PSS and the SSS, the same signals are always transmitted. Thus, as shown in FIG. 2, by accumulating the same signals received over time as much as possible, the SNR of the received signal is sufficiently secured.

However, the PBCH signal contains system frame number (SFN) information that is "changed every frame". Therefore, the same signals are not always transmitted, and thus it is impossible to simply accumulate the signals over time. Therefore, the reception performance of the PBCH signal has a decisive influence on the success of call access at the edge of the cell. Accordingly, in order to enhance the performance of the 5G NR receiver, a technique for effectively accumulating the PBCH signals as much as possible is very important.

The foregoing is intended merely to aid in the understanding of the background of the present invention, and is not intended to mean that the present invention falls within the purview of the related art that is already known to those skilled in the art.

DOCUMENT OF RELATED ART (Patent Document 1) KR 10-2017-0044648 A.

SUMMARY OF THE INVENTION

Accordingly, the present invention has been made keeping in mind the above problems occurring in the related art, and the present invention is intended to propose a method and a PBCH decoder using the method, the method being capable of enhancing the reception performance of a 5G NR receiver by effectively accumulating PBCH signals received in a 5G NR communication system.

In order to achieve the above objective, according to one aspect of the present invention, there is provided a method of accumulating and decoding a physical broadcasting channel (PBCH) signal received by a 5G New Radio (NR) receiver, the method including: generating an inversion vector for negating at least one bit of a system frame number (SFN) included the received PBCH signal; performing accumulation over at least one frame by performing modulo addition on the generated inversion vector and the received PBCH signal; decoding the accumulated PBCH signals; and checking validity of the decode PBCH and reconstructing the SFN.

The inversion vector may be a vector for changing SFN information, which is changed every frame, by using a linearity characteristic of a polar code so that the SFN information always has the same value in the at least one bit.

The checking of the validity of the decoded PBCH may be performed by checking an SFN component of the decoded PBCH.

The inversion vector may be generated by performing encoding in a polar coding scheme from a payload where only the bit to be negated has a value of "1".

The reconstructing of the SFN may be reconstruction into the original SFN included in the received PBCH.

At the generating of the inversion vector, with respect to at least one combination of the bits to be negated, at least one inversion vector having different SFN start points in time for respective frames may be generated for each candidate.

At the performing of the accumulation, the accumulation may be performed over the at least one frame by performing the modulo addition, for each candidate, on the received PBCH signal and the generated inversion vector.

The reconstructing of the SFN may be reconstruction by performing a reverse operation from the candidate corresponding to the inversion vector for the decoded PBCH of which the validity is checked.

The number of the candidates may be adjusted by comparing sums of absolute values of the received signals for each candidate every particular point in time.

According to another aspect of the present invention, there is provided a computer program stored on a computer-readable recording medium, the program for executing the method according to any one of the above-described methods.

According to still another aspect of the present invention, there is provided a computer-readable recording medium having a program recorded thereon, the program for executing the method according to any one of the above-described methods.

In order to achieve the above objective, according to still another aspect of the present invention, there is provided a physical broadcasting channel (PBCH) decoder including: an inversion vector generation unit generating an inversion vector for negating at least one bit of a system frame number (SFN) included in a received PBCH signal; an accumulation storage unit performing accumulation over at least one frame by performing modulo addition on the received PBCH signal and the generated inversion vector; a payload decoding unit decoding the accumulated PBCH signals; and an SFN reconstruction unit checking validity of the decoded PBCH and reconstructing the SFN.

The inversion vector may be a vector for changing SFN information, which is changed every frame, by using a linearity characteristic of a polar code so that the SFN information always has the same value in the at least one bit.

The inversion vector may be generated by performing encoding in a polar coding scheme from a payload where only the bit to be negated has a value of "1".

The checking of the validity of the decoded PBCH may be to determine whether an SFN component of the decoded PBCH is "0".

The reconstructing of the SFN may be reconstruction into the original SFN included in the received PBCH.

The inversion vector generation unit may generate, for each candidate, at least one inversion vector having different SFN start points in time for respective frames, with respect to at least one combination of the bits to be negated.

The accumulation storage unit may perform the accumulation over the at least one frame by performing the modulo addition, for each candidate, on the received PBCH signal and the generated inversion vector.

The reconstructing of the SFN may be reconstruction by performing a reverse operation from the candidate corresponding to the inversion vector for the decoded PBCH of which the validity is checked.

The number of the candidates may be adjusted by comparing sums of absolute values of the received signals for each candidate every particular point in time.

The accumulation storage unit may perform softcombining.

In order to achieve the above objective, according to still another aspect of the present invention, there is provided a 5G NR receiver including the PBCH decoder.

As described above, according to the present invention, there is provided the accumulation method in which the inversion vector for "negating" the SFN information, which is changed every frame in the PBCH signal, is generated by using the linearity characteristic of the polar code, and then the inversion vector and the received PBCH signal are subjected to modulo addition, so that the SFN information changed with time always has the same value and thus the PBCH signals can be accumulated over time. Further, there is provided the PBCH decoder that reconstructs the negated SFN information after signal detection, and thus by accumulating the PBCH signals, the SNR of the signal received by the 5G NR receiver can be improved, and the reception performance at the outside of the cell can be enhanced.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Hereinbelow, exemplary embodiments of the present invention will be described in detail with reference to the accompanying drawings such that the invention can be easily embodied by those skilled in the art to which this invention belongs. In the following description, only parts necessary for understanding the operation according to an embodiment of the present invention are shown and described, and the illustration and description of other parts are omitted so as not to obscure the gist of the present invention. However, the present invention may be embodied in various different forms and should not be limited to the embodiments set forth herein.

Also, all terms or words used herein should not be interpreted as being limited merely to common and dictionary meanings but should be interpreted as having meanings and concepts which are defined within the technical idea of the present invention in order to describe the present invention most appropriately.

While, for purposes of simplicity of description, the one or more methods shown herein, e.g., in the form of a flowchart or flow diagram, are shown and described as a series of steps, it is to be understood and appreciated that the invention is not limited by the order of steps, as some steps may, in accordance therewith, occur in a different order and/or concurrently with other steps from that shown and described herein. Moreover, not all illustrated steps may be required to implement a method in accordance with the invention.

As used herein, the singular forms "a", "an", and "the" are intended to include the plural forms as well, unless the context clearly indicates otherwise. It is to be understood that the terms "comprise", or the like where used herein, specify the presence of stated features, numbers, steps, operations, elements, components or combinations thereof, but do not preclude the presence or addition of one or more other features, numbers, steps, operations, elements, components, or combinations thereof.

Prior to describing and illustrating figures in detail, a division of the configuration units in the present invention is intended for ease of description and divided only by the main function set for each configuration unit. That is, two or more of the configuration units to be described hereinafter may be combined into a single configuration unit or famed by two or more of divisions by function into more than a single configuration unit. Furthermore, each of the configuration units to be described hereinafter may additionally perform a part or all of the functions among functions set for other configuration units other than being responsible for the main function, and a part of the functions among the main functions set for each of the configuration units may be exclusively taken and performed by other configuration units.

Figure 3:
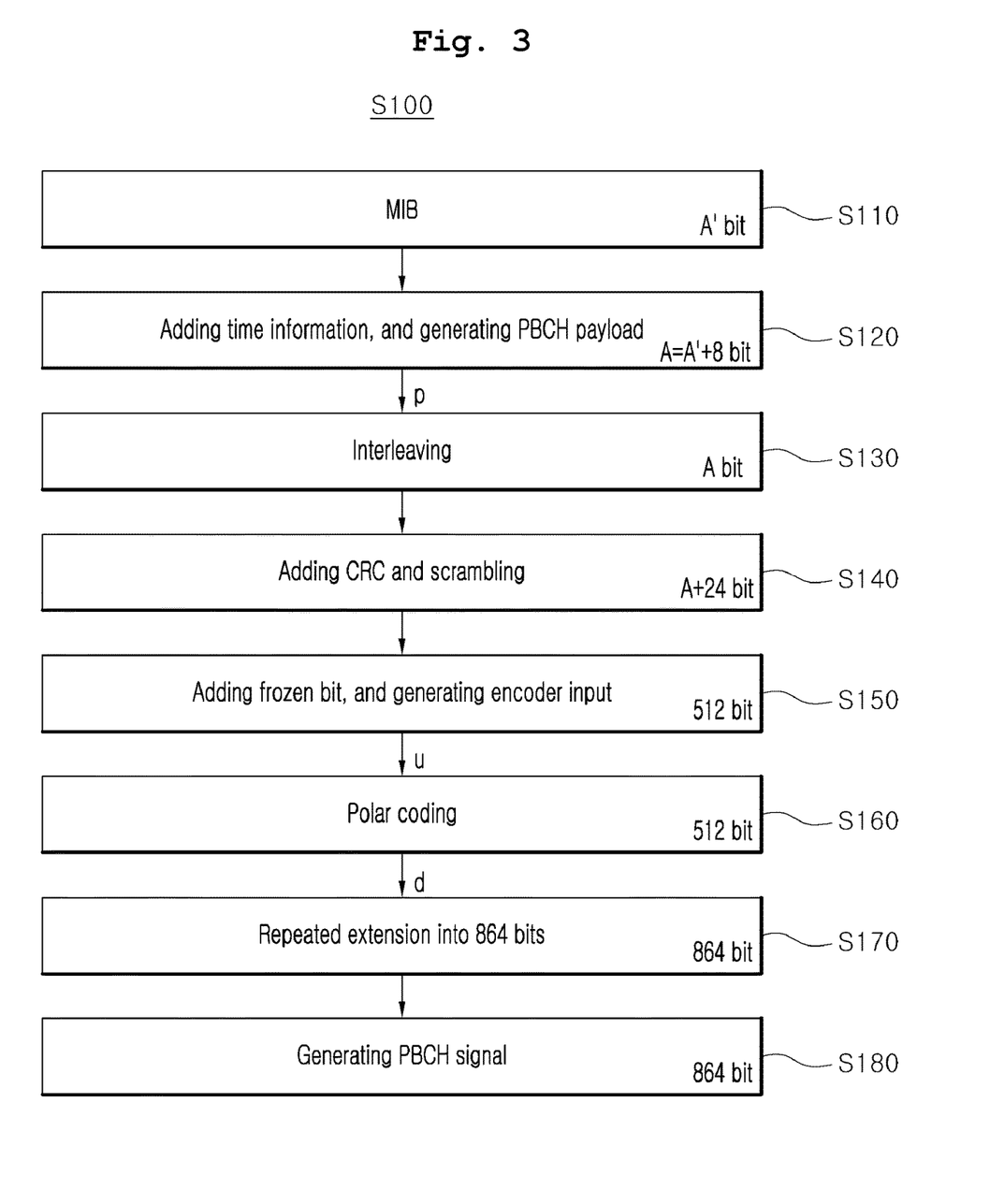
FIG. 3 is a flowchart illustrating a detailed example of a process of encoding a PBCH signal by a transmitter of a system according to a 5G NR standard.
Figure 4:
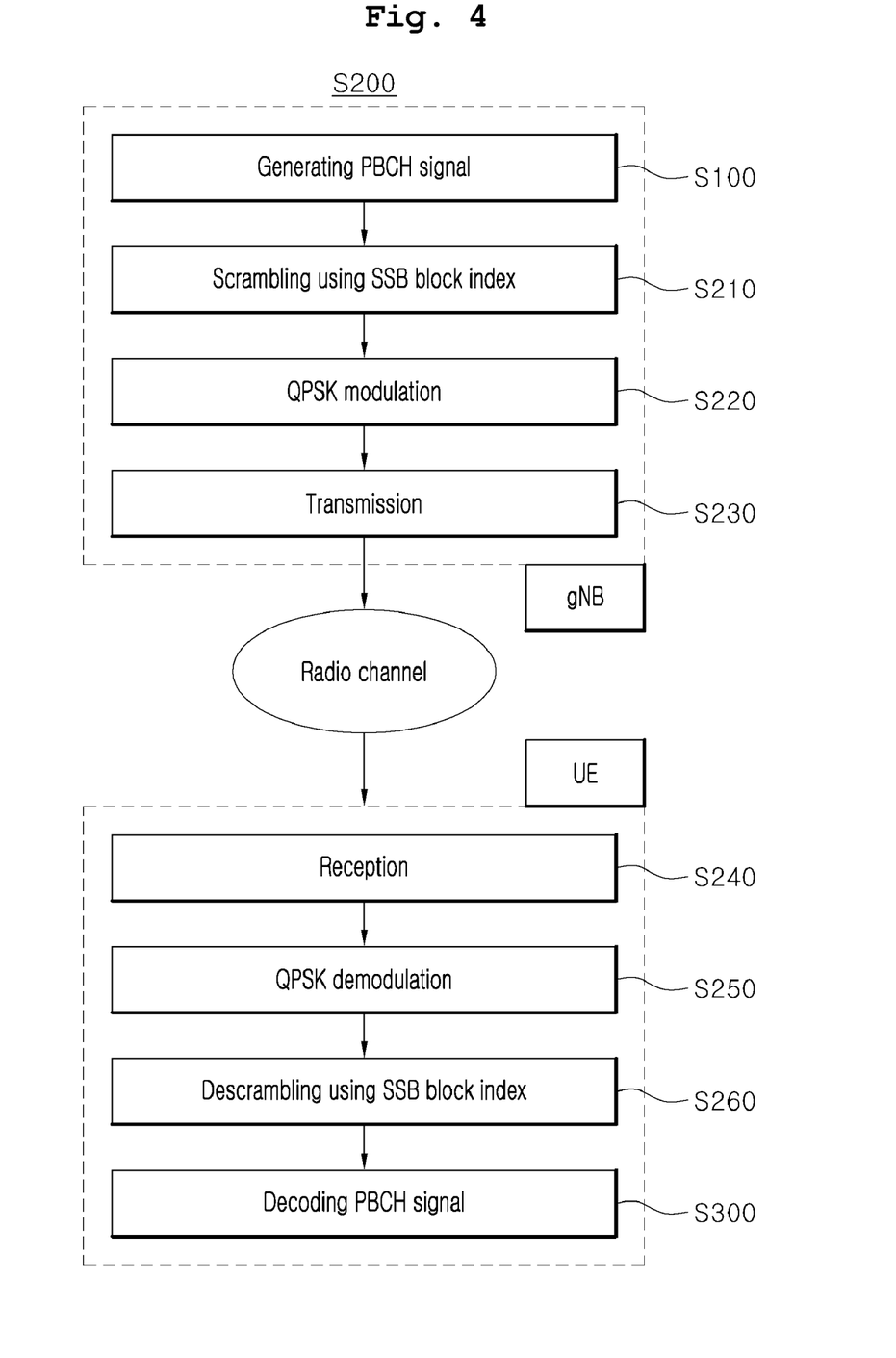
FIG. 4 is a flowchart illustrating, in a system according to a 5G NR standard, a detailed example of a process of modulating a PBCH signal to transmit the modulated signal to a receiver over a radio channel, and of demodulating the received signal in the receiver.
Figure 5:
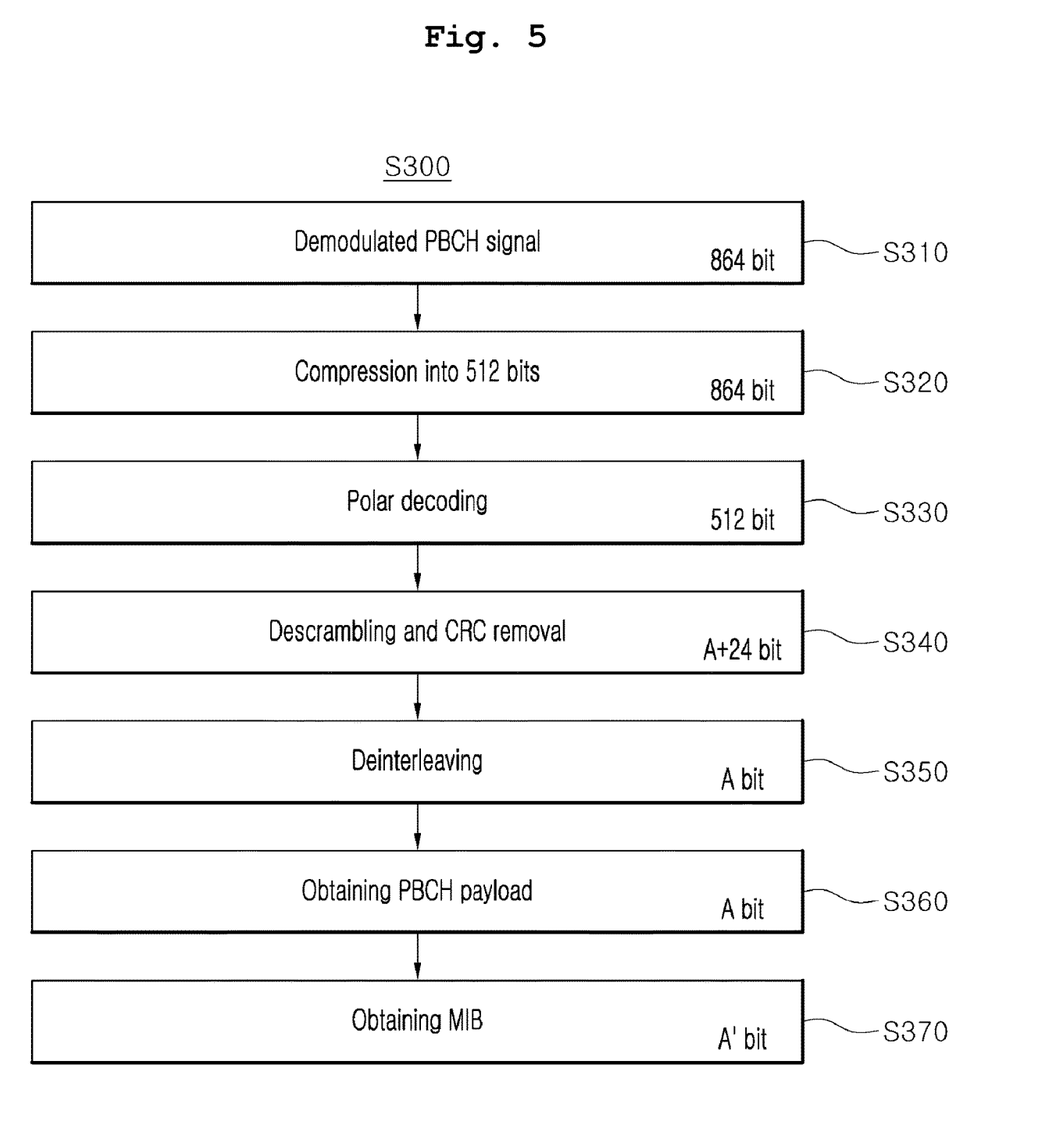
FIG. 5 is a flowchart illustrating a detailed example of, in a 5G NR receiver, a process of reconstructing a PBCH payload by decoding a demodulated PBCH signal.

FIG. 3 is a flowchart (S100) illustrating a detailed example of a process of encoding a PBCH signal by a transmitter of a system according to a 5G NR standard. FIG. 4 is a flowchart (S200) illustrating a detailed example of a process of modulating an encoded PBCH signal, of transmitting the modulated signal to a receiver over a radio channel, and of demodulating the received signal in the receiver. FIG. 5 is a flowchart (S300) illustrating, in a 5G NR receiver, a process of reconstructing a PBCH payload by decoding the demodulated PBCH signal.

FIG. 3 shows the flowchart (S100) in which the PBCH signal is encoded. Time information, or the like is added to an MIB (A' bit at step S110) to generate a PBCH payload (A bit) at step S120.

The PBCH payload generated at step S120 is subjected to interleaving at step S130, the result is subjected to scrambling at step S140 by adding 24 bits for cyclic redundancy code (CRC) (i.e., 24 bit CRC) to detect a transmission error, a frozen bit is added to the result to generate a 512-bit encoder input (u) at step S150, and the result is encoded in a polar coding scheme, which is a linear block error correcting code, at step S160.

The PBCH payload encoded using polar coding is repeatedly extended into 864 bits at step S170, and then the final PBCH signal is generated at step S180.

The PBCH signal generated through the process shown in FIG. 3 is received by a UE (5G NR receiver) from a base station (gNB) over a radio channel through a process shown in FIG. 4.

Referring to FIG. 4, the PBCH signal generated through the flowchart S100 of FIG. 3 is subjected to scrambling at step S210 using an SSB block index, the result is subjected to QPSK modulation at step S220, and the result is transmitted over a radio channel at step S230.

The PBCH signal received at step S240 by the UE is subjected to QPSK demodulation at step S250 and descrambling at step S260, and then the result is decoded at step S300.

FIG. 5 shows the flowchart S300 illustrating a process of reconstructing the PBCH payload by decoding the demodulated PBCH signal in the UE (5G NR receiver). The demodulated PBCH signal is decoded in the reverse order of the flowchart S100 of FIG. 3 and thus is reconstructed to the original PBCH payload (over steps S310 to S370).

In the 5G NR communication system, the PBCH payload is composed of information that varies with time, such as the SFN information, and other types of information that is always fixed. Further, the PBCH payload is encoded in the polar coding scheme.

The polar code is a type of linear block error correction code and has a linearity characteristic. By using the linearity characteristic of the polar code, it is possible to "separate the effect of a particular bit in the encoder input" from the result of encoding using polar coding.

The present invention is directed to utilize the linearity characteristic of the polar code, and enables PBCHs to be accumulated over multiple frames so that the reception performance of the PBCHs is enhanced.

Hereinafter, a method of "negating" the SFN information, which is changed every frame, in the PBCH by using the linearity characteristic of the polar code will be described. By "negating" the SFN information changed every frame, the information that is changed with time always has the same value and thus is accumulated over time. Therefore, due to the accumulation, the SNR is improved, and the reception performance at the edge of the cell is expected to be enhanced.

The "negating" of the SFN information changed every frame refers to that because simply accumulating the bit changed every frame makes the result of the accumulation meaningless, information on the bit is removed so that the bit is not changed. In other words, the SFN increases by "1" every frame. An appropriate processing operation is performed so that the value of the SFN is always "0". The information removed during this process may be reconstructed later.

The technical background of this concept may be summarized as follows.

(1) Accumulation of the same signals enhances the quality of the signal.

(2) The PBCH signals have the same information except for the SFN information indicating the frame number, and the SFN increase every frame with time.

(3) When a bit string including the SFN information is negated so as not to be changed with time during a particular section, the PBCH signals are the same during the section and thus are accumulated.

(4) Because the original SFN information is information to be used by the receiver, the negated SFN is reconstructed after decoding. [Stop Here]

In the PBCH of the 5G NR system, two lower-order bits of the SFN except for the LSB are excluded from scrambling, and according to this value (0b00, 0b01, 0b10, or 0b11), a scrambling pattern applied to the signal of the SFN is determined. That is, starting from the case of 0b00 that is the actual value of the two lower-order bits of the SFN except for the LSB, to the case of 0b01, the case of 0b10, and the case of 0b11, when performing accumulation after descrambling, accumulation is possible with respect to a total of four received signals. However, since the actual value of the SFN is unknown, the assumption about the start point in time is required for the value of the two low-order bits of the SFN except for the LSB.

Accordingly, as an example, when one bit of the SFN in which scrambling has been performed is further negated, the number of signals that are possibly accumulated is increased so that the reception performance is improved. More specifically, in the 5G NR system, the SFN consists of a total of 10 bits and is changed every frame. Since the maximum period of PBCH reception guaranteed by the standard is two frames, when it is assumed that PBCH reception is attempted every two frames, the LSB always has a fixed value. Further, the two bits immediately preceding the LSB are induced to be accumulated according to the standard. Therefore, it means that one of the remaining seven bits excluding the above-described bits is further negated for accumulation.

The encoding process of the polar coding scheme used for the 5G NR PBCH is as follows.

The input $u=[u_0, u_1, \ldots, u_{N-1}]$ of the encoder consists of the payload $p=[p_0, p_1, \ldots, p_{A-1}]$ and the frozen bit of "0", where the positions of the respective payload bits and frozen bits follow the 5G NR standard. Herein, the result $d=[d_0, d_1, \ldots, d_{N-1}]$ of encoding into a polar code is calculated as in Equation 1.

$$d = u \cdot G_N \quad \text{[Equation 1]}$$

In Equation 1, $G_N = G_2^{\otimes n}$ and $$G_2 = \begin{bmatrix} 1 & 0 \\ 1 & 1 \end{bmatrix}.$$

That is, $G_N$ is the n-th Kronecker power of $G_2$ (N=512, n=9). In the payload P, for A, typically 56 bits are used (higher layer message 24 bits+additional information 8 bits+CRC 24 bits).

As described above with reference to FIGS. 3 and 4, regarding the 5G NR PBCH, the 512 bits encoded using polar coding is extended to 864 bits in a simply repeated manner, and the result is subjected to secondary scrambling and to QPSK modulation for transmission.

In the case of using the linearity characteristic of the polar code, even when u is divided into two parts ($u_0$, $u_1$), wherein ($u=u_0 \oplus u_1$), and each of the two parts is encoded and then the resulting two parts are subjected to modulo addition, the same result as in Equation 2 is obtained.

$$d = u \cdot G_N = (u_0 \oplus u_1) \cdot G_N = u_0 \cdot G_N \oplus u_1 \cdot G_N = d_0 \oplus d_1$$

where $d_0 = u_0 \cdot G_N$, $d_1 = u_1 \cdot G_N$ [Equation 2]

In the case of using the linearity characteristic of the polar code, when the original d and the value $d_m v_k \cdot G_N$ obtained by encoding an input $v_k = [(v_0=0), (v_1=0), \ldots, (v_k=1), \ldots, (v_{A-1}=0)]$ where only "a bit of a particular position" has a value of "1" into a polar code are subjected to modulo addition, the $k^{th}$ bit is inverted as shown in Equation 3.

$$d' = (d \oplus d_m) = (u \oplus v_k) \cdot G_N = \quad \text{[Equation 3]}$$
$$\begin{cases} \begin{bmatrix} (u'_0 = u_0), (u'_1 = u_1), \ldots, \\ (u'_k = 0), \ldots, (u'_{N-1} = u_{N-1}) \end{bmatrix} \cdot G_N, & \text{when } u_k = 1 \\ \begin{bmatrix} (u'_0 = u_0), (u'_1 = u_1), \ldots, \\ (u'_k = 1), \ldots, (u'_{N-1} = u_{N-1}) \end{bmatrix} \cdot G_N, & \text{when } u_k = 0 \end{cases}$$

Accordingly, when using Equation 3, an "inversion vector" that is a vector for inverting each bit of the SFN is generated. That is, assuming that the position of the bit to be negated is k and the value ($u_k$) is changed every frame, when an appropriate inversion vector is selected every frame and is used, $u_k$ is always negated into "0" and it is possible to perform accumulation every frame.

Hereinafter, a method of generating such an "inversion vector" will be described.

Figure 6:
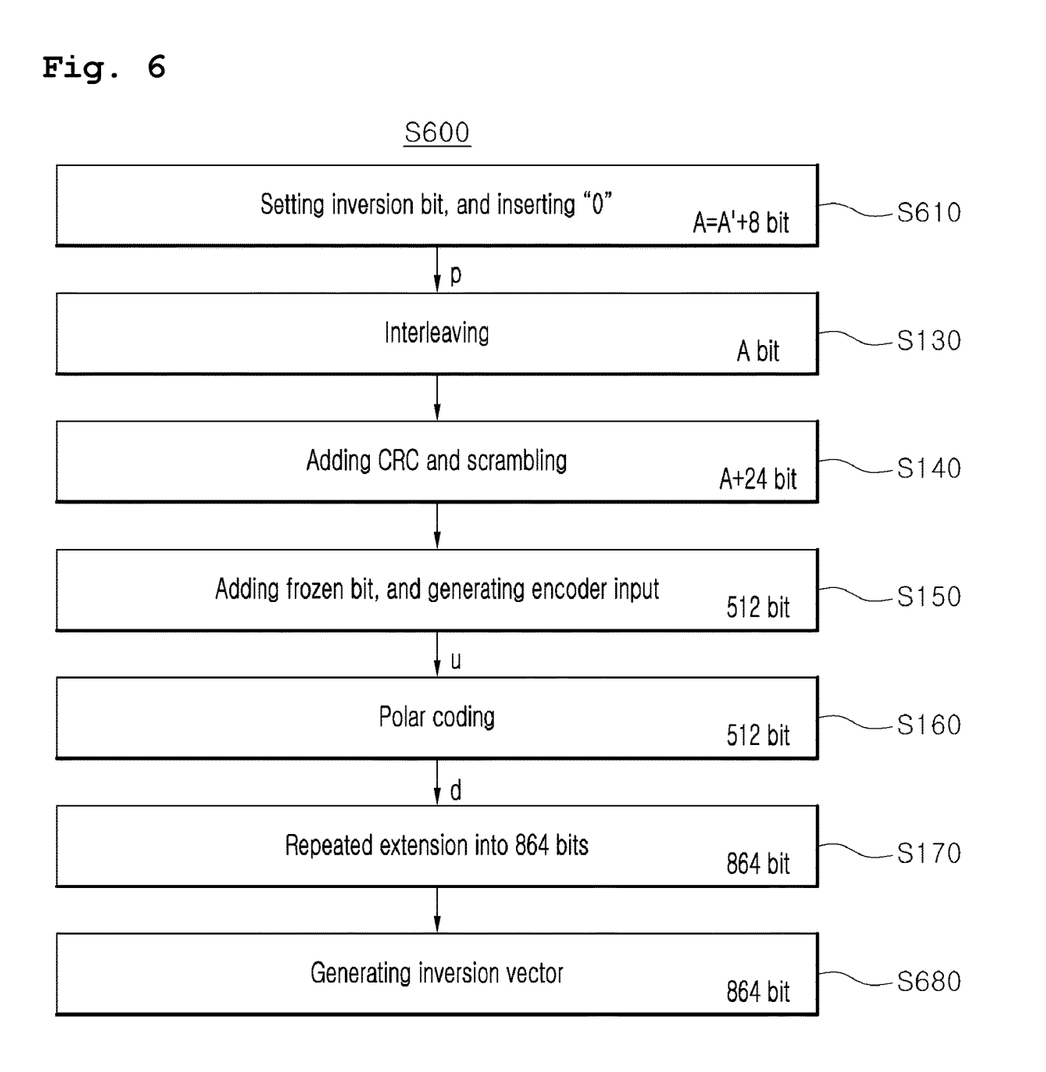
FIG. 6 is a flowchart illustrating a detailed example of a method of generating an inversion vector by setting a bit for inversion according to an embodiment of the present invention.
Figure 7:
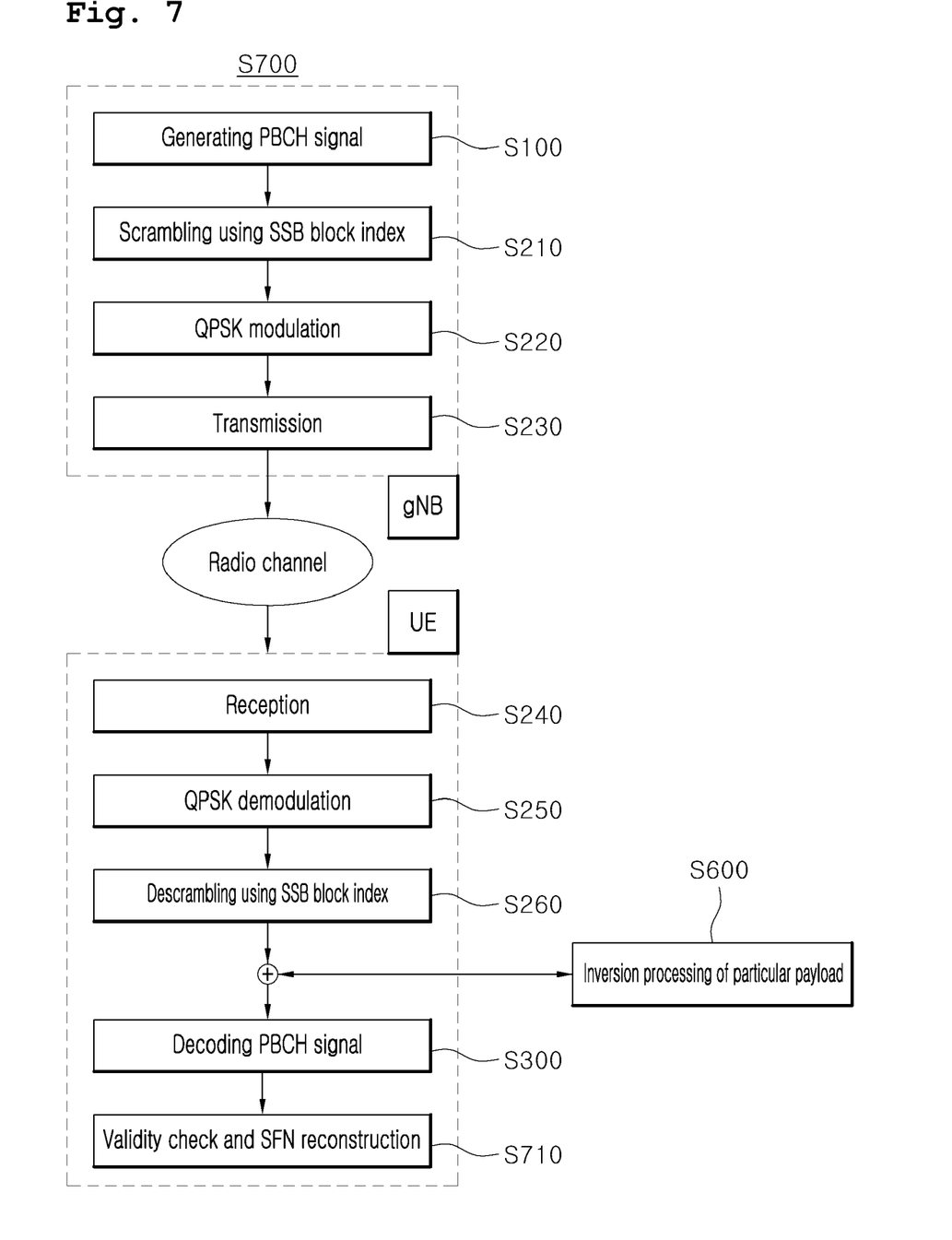
FIG. 7 is a flowchart illustrating a detailed example of a PBCH decoding method using an inversion vector according to an embodiment of the present invention.

FIG. 6 is a flowchart (S600) illustrating a detailed example of a method of generating an inversion vector by setting a bit for inversion according to an embodiment of the present invention. FIG. 7 is a flowchart (S700) illustrating a detailed example of a PBCH decoding method using an inversion vector according to an embodiment of the present invention.

Referring to FIG. 6, compared to FIG. 3 (showing the detailed example of the process of encoding the PBCH signal by the transmitter), the same process as the steps S130 to S170 is included except for steps S610 and S680.

That is, the inversion vector is generated by the UE. The method of generating the inversion vector includes the encoding process the same as the process of encoding the PBCH signal in the transmitter (base station).

In FIG. 3, the position indicating the SFN in the payload before interleaving (S130) may be represented as in Equation 4.

$$p = [sfn_9, sfn_8, \ldots, sfn_0, \ldots, p_{A-1}] \quad \text{[Equation 4]}$$

Similar to the process of encoding the "PBCH payload" in Equation 4 by using polar coding by the transmitter, the "inversion vector payload" in Equation 4 is encoded using polar coding by the UE to generate the inversion vector as in the following example. That is, it is possible to generate the inversion vector through the same process as that of FIG. 3 in which only the PBCH payload is changed and the existing PBCH signal is generated.

As an example, when a vector inverting the second LSB of the SFN is generated, an "inversion vector payload" in which the value of the $sfn_1$ position in Equation 4 is 1 and the remaining values are "0" is generated at step S610.

That is, from the inversion vector payload generated at step S610, through the same process as the steps S130 to S170 in FIG. 3, the inversion vector (m) of final 864 bits may be generated at step S680.

In summary, according to the 5G NR standard, a frozen bit is inserted into $p_{\text{"0000000010"}} = [0,0, \ldots, (sfn_1=1), \ldots, 0]$ to generate $u_{\text{"0000000010"}}$ that is a form of input of a polar code encoder, and polar coding is performed to generate the inversion vector $m_{\text{"0000000010"}}$.

FIG. 7 shows a flowchart S700 illustrating a detailed example of a PBCH decoding method using the inversion vector, and it is found that steps S600 and S710 are added to the flowchart S200 in FIG. 4.

That is, when the PBCH signal in which descrambling is performed at step S260 and the inversion vector (m) are subjected to modulo addition, the components corresponding to $sfn_1$ in the received signal are inverted. Specifically, when applied to the received signal at the point in time of $sfn_1=1$, the value of $sfn_1$ is changed to "0".

Therefore, PBCH decoding using the inversion vector according to the present invention is that the step S600 is just added to the conventional reception process of the UE.

Afterward, at step S710, a validity check and SFN reconstruction are performed. When the SFN in which reception starts matches a pre-assumed candidate, all the SFNs over time have a value of 0 due to the inversion. Therefore, the validity is verified by checking the SFN component of the payload that has been successfully decoded and passed the CRC. The valid payload has the SFN component of which the value is "0".

When the valid payload is verified, the values of the three lower-order bits of the SFN excluding the LSB, which have been inverted into "0", are reconstructed into the actual SFN by performing the reverse operation from the starting SFN that is assumed in the successfully decoded candidate.

Extending the above method, multiple bits in the SFN may be inverted.

As an example, regarding the inversion vector for making the three lower-order bits of the SFN of the signal received at SFN=7(0b0000000111) to be "0", when the payload of $p_{\text{"0000000111"}} = [0,0, \ldots, (sfn_2=1), (sfn_1=1), (sfn_0=1), \ldots, 0]$ is encoded into a polar code according to the flowchart S600, the inversion vector $m_{\text{"0000000111"}}$ is generated.

Herein, when using the linearity characteristic of the polar code, the same vector is generated through the operation of $m_{\text{"0000000010"}} = m_{\text{"0000000100"}} \oplus m_{\text{"0000000010"}} \oplus m_{\text{"0000000001"}}$.

That is, if only three vectors for inverting each of the three lower-order bits of the SFN are provided, a total of eight vectors ranging from 0 to 7 may be generated using combinations of modulo additions of the three vectors. Therefore, using this characteristic, it is possible to generate all vectors for the desired SFN.

In the meantime, according to the above-described embodiments, the change of the LSB has been described assuming a general case where the PBCH is received every frame. However, in the 5G NR system, at the initial access step, since the SSB block is configured so that the PBCH is received once every two frames (=20 ms), and thus the LSB has a fixed value.

That is, when receiving starts from the even-numbered SFN, only the even-numbered SFNs are received. When receiving starts from the odd-numbered SFN, only the odd-numbered SFNs are always received. Therefore, in the 5G NR system, the reception takes place with the LSB fixed originally, so the LSB does not need to be negated.

Figure 8:
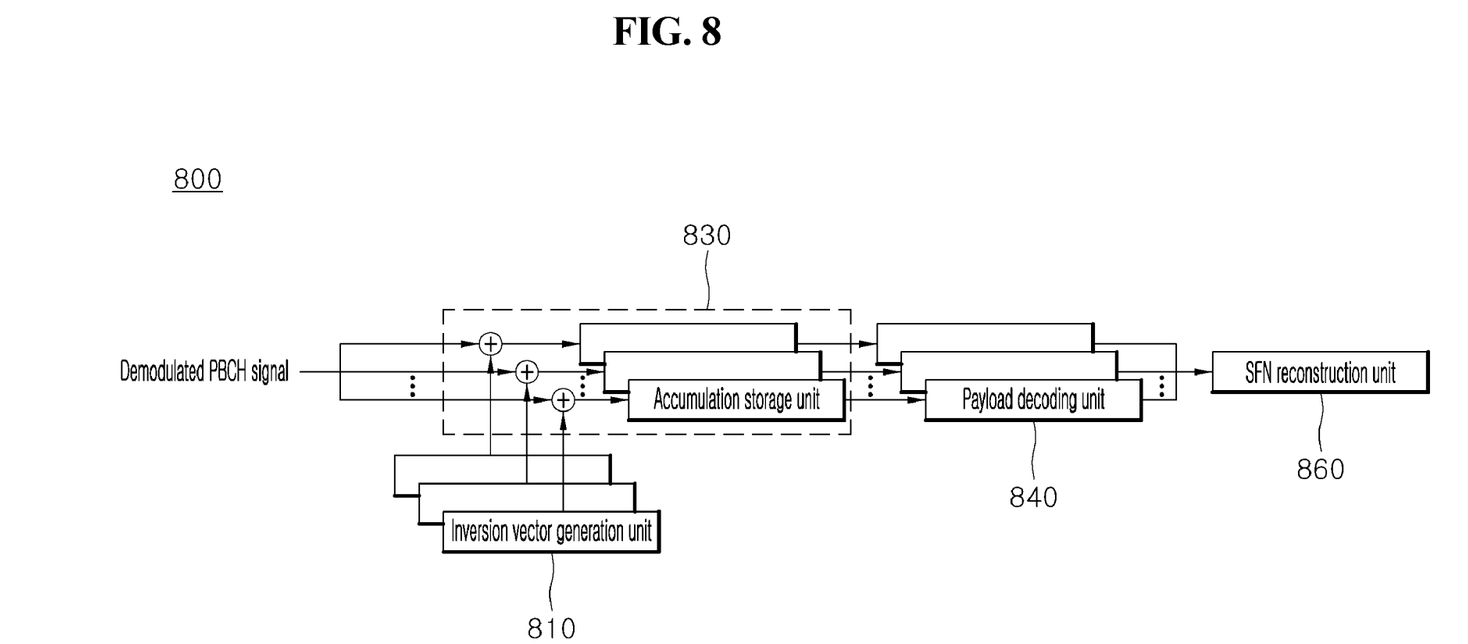
FIG. 8 is a block diagram illustrating a PBCH decoder according to an embodiment of the present invention.
Figure 9:
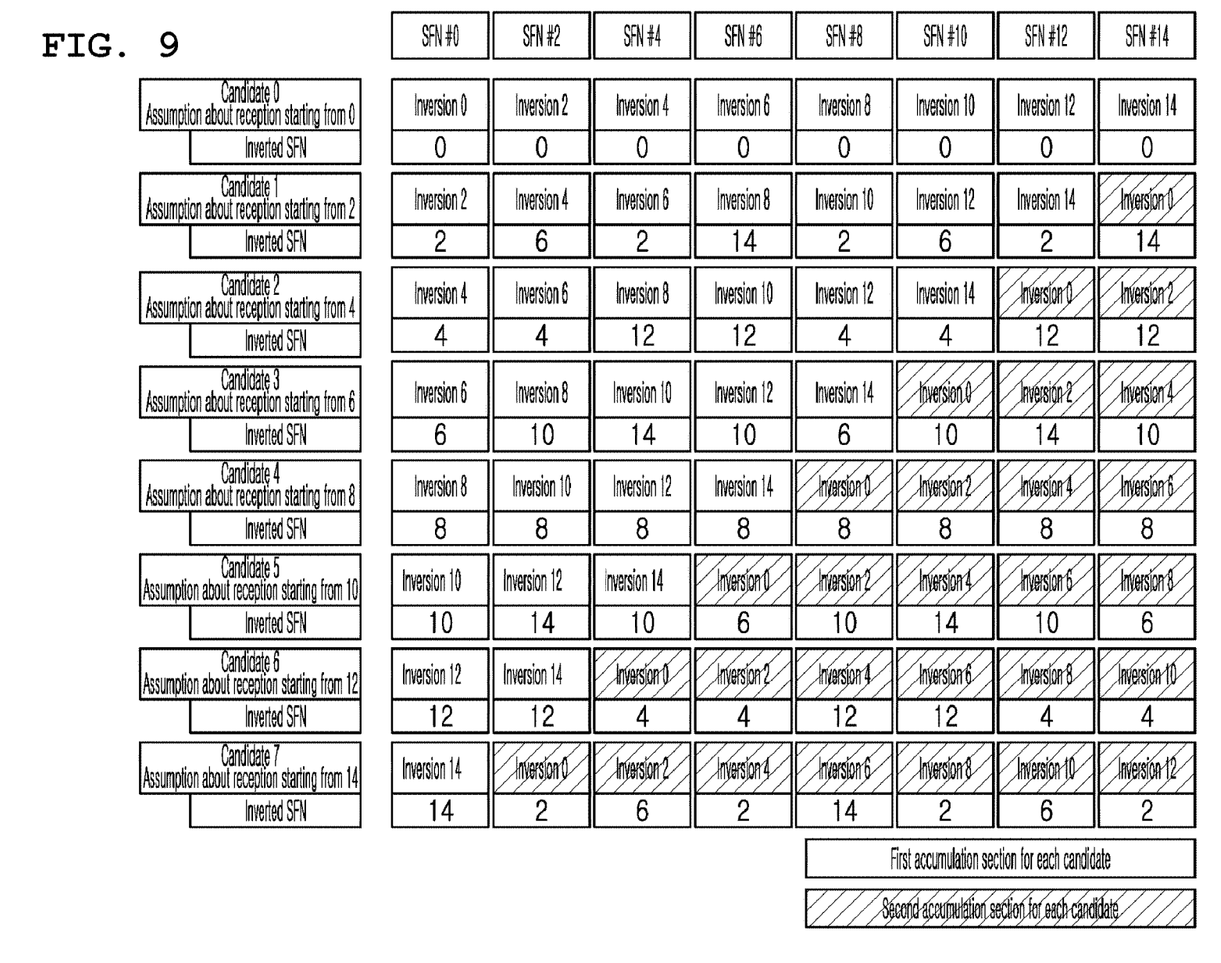
FIG. 9 is a diagram illustrating an example of change in an inversion vector used over time for each candidate in accordance with assumption about a starting SFN, and inversion of SFN information actually transmitted with respect to each example according to an embodiment of the present invention.

FIG. 8 is a block diagram illustrating a PBCH decoder 800 according to an embodiment of the present invention. FIG. 9 is a diagram illustrating an example of change in an inversion vector used over time for each candidate in accordance with assumption about a starting SFN, and inversion of SFN information actually transmitted with respect to each example.

Referring to FIG. 8, a PBCH decoder 800 according to the present invention includes an inversion vector generation unit 810, an accumulation storage unit 830, a payload decoding unit 840, and an SFN reconstruction unit 860.

The inversion vector generation unit 810 generates the inversion vector described with reference to FIG. 6. That is, at least one position of the bit to be inverted may be set, and according to the set position, the inversion vector payload may be generated. Then, the polar coding may be performed from the inversion vector payload, so that the inversion vector may be generated.

The inversion vector generation unit 810 may generate the inversion vector "for each candidate". For a payload bit that is changed periodically, the inversion vector that exactly matches the period is selectively applied so that all payloads on which inversion processing is performed have the same value of "0" and thus are accumulated with each other. However, the UE (receiver) is "unable to know the SFN at the reception start point in time", and thus the inversion vectors need to be generated for all possible candidates.

More specifically, the SFN at the reception start point in time may be known by decoding the PBCH. However, in order to enhance the reception performance of the PBCH, PBCH decoding needs to be performed after accumulation over multiple (eight) frames. Therefore, the inversion vector needs to be generated for each candidate, the PBCH signals need to be accumulatively stored for each candidate, and decoding needs to be performed for each candidate. Herein, the candidates are determined as assumptions for the SFN at each reception start point in time. Only the candidate for the assumption in which the SFN and the actual SFN match has improved signal quality, and thus the candidate is normally decoded. The other seven candidates are not normally decoded.

For example, in a situation where a signal is received every two frames in the 5G NR system, it is assumed that three lower-order bits excluding the LSB of the SFN are set to be negated.

Then, a total of eight inversion vectors for negating the SFN are required. That is, even though the first PBCH at the reception start point in time is unknown, this is at least one value of the lower-order bits that the eight inversion vectors represent. Therefore, this is set as a candidate for each assumption.

Referring to FIG. 9, the SFN of the PBCH received every frame continues to increase, and thus the inversion vector used for each candidate is also applied using the inversion vector that represents the increased SFN from the assumption. Assuming the actual starting SFN is 0, when accumulation takes place once every two frames a total of eight times, the receiver receives SFNs 0, 2, 4, 6, 8, 10, 12, and 14. There are a total of eight candidates for the assumptions. Among them, the candidate starting with SFN 0 uses the same inversion vectors as the SFN that is actually received. Therefore, all the SFNs are negated and thus have values of 0, 0, 0, 0, 0, 0, 0, and 0. Having the same values, accumulation is possible.

On the other hand, in the case of the candidate starting with SFN 2, the inversion vectors use 2, 4, 6, 8, 10, 12, 14, and 0, respectively. Therefore, the SFNs differ and thus are not normally negated, so that the result of accumulation is meaningless. Similarly, regarding to the remaining six candidates where the assumptions do not match, the SFNs differ and thus the result of accumulation is meaningless.

The accumulation storage unit 830 causes the PBCH signal for each candidate to be subjected to inversion processing and accumulatively stores the results. Herein, the length of each vector is 864 bits corresponding to the polar code. However, the 864 bits are generated by simple repetition of 512 bits that are the result of the polar code encoding. Thus, in practice, only 512 bits are stored, and then used repeatedly.

In the case of the PBCH in the 5G NR, the SFN information (10 bits) is information that is changed every frame (10 ms). As shown in FIG. 9, in the case where the SFN at the accumulation start point in time is assumed to be an arbitrary candidate, and where inversion processing and accumulation take place using the vectors that are increased sequentially from the starting SFN every reception unit, when the starting SFN of the assumed candidate matches the actual SFN, all pieces of the received SFN information are changed to "0". That is, all payloads have the same value regardless of the SFN. Therefore, accumulation is possible, and thus the SNR of the reception signal may be improved by soft combining.

Soft combining is a method of adding a signal received at another point in time while final decoding into 0 or 1 has not taken place yet, specifically, with the original reception signal. The reception signal contains original signal components and noise components that follows a normal distribution. If the signals received every frame are the same, when all the reception signals are added together, the signal components increase in size as much as the signals are added. In contrast, the noise components are random signals and thus do not increase as much as the signal components increase. Therefore, the SNR is a signal-to-noise ratio, and when accumulated, the increase in signal size is greater than the increase in noise. Consequently, the SNR is improved.

As an example, when PBCH reception is performed every two frames (20 ms) and the three bits (sfn #6, sfn #7, sfn #8) excluding the LSB among the four lower-order bits of the SFN are used as the inversion vectors, a total of eight candidates are generated, which corresponds to a case where the three lower-order bits excluding the LSB of the SFN have values of 0, 1, . . . . Therefore, accumulation is possible during up to eight PBCHs (=8*20 ms=160 ms). When the performance is compared with that of the case of no accumulation, it is expected that the performance is enhanced by 9 dB in the general case. In this example, as the SFN values of the payload on which inversion processing is performed for each candidate, the values shown in FIG. 9 are used.

The payload decoding unit 840 decodes the PBCH signals on which inversion processing is performed each candidate and which are accumulated. Decoding of the PBCH signal may go through the process S300 in FIG. 5.

The SFN reconstruction unit 860 performs a validity check and reconstruction of the inverted SFN. When the SFN in which reception starts matches the assumed candidate, all the SFNs over time have values of 0 due to inversion. Therefore, the validity is verified by checking the SFN component of the payload that has been successfully decoded and passed the CRC. The valid payload has the SFN component of which the value is "0". When the valid payload is verified, the values of the three lower-order bits of the SFN excluding the LSB, which have been inverted into "0", are reconstructed into the actual SFN by performing the reverse operation using the SFN of the successfully decoded candidate.

In an example embodiment, SFN reconstruction may be a process of recovering SFN negated (i.e., disappeared SFN) of the received PBCH signal. Since the PBCH signals of two or more frames to be accumulated have different SFNs, the SFNs are negated (i.e., are changed to a predetermined binary value such as 0) in the accumulation of the received PBCH signal. In decoding of the accumulated PBCH, since the SFN of the PBCH signal disappears in the accumulation, a candidate SFN is assumed for the PBCH signal for each decoding trial. When a trial decoding is successful with a candidate SFN, the disappeared SFN can be recovered using the candidate SFN (i.e., the assumed SFN) and the number of accumulation (i.e., the number of accumulated frames).

For example, it is assumed that the number of accumulation is N and the candidate SFN at which a trial decoding is determined as successful is M. The decoded PBCH payload (i.e., the decoded PBCH signal) has negated SFN (i.e., all bits of the negated SFN has a binary value "0".). After performing a successful trial decoding with the candidate SFN, the 5G radio receiver may identify the current SFN as a sum of M and N because the accumulation starts with a frame of which SFN is N and the M frame is accumulated. In doing so, the 5G radio receiver may recover the original SFN of the decoded PBCH signal.

In the meantime, as the number of bits to be used as the inversion bits is increased, the reception performance of the PBCH may be improved, and up to 10 bits corresponding to the maximum SFN region may be used. As the number of SFN bits used for accumulation is increased, the SNR of the reception signal is improved and thus, the reception performance is enhanced. However, when n bits are used as the inversion bits, the number of candidates to be assumed is $2^n$. Therefore, the complexity of implementation increases, so it is preferable to consider the performance and the trade-off.

In the case where the entire maximum SFN region is used, in other words, where it is assumed that the PBCH reception of 20 ms is attempted, when all nine bits excluding the LSB of the SFN are used as the inversion bits, infinite accumulation is possible. However, there is a burden of accumulating and comparing a total of 512 candidates. In this case, when using a "scheme of reducing the candidates every particular point in time", it is possible to limit the number of candidates to be managed practically and to perform infinite accumulation. That is, when the correct candidate is selected and inverted for accumulation, all the same reception signals are accumulated and thus the absolute value of each reception signal increases. Therefore, in order to reduce the candidates, at the time of comparison, "comparison with the sum of absolute values of the reception signals" is performed for each candidate to leave only half of the higher order, and with respect only to the remaining candidates, the next candidate group may be further expanded.

For example, in the case of managing eight candidates, after accumulating a total of eight times, the sums of the absolute values of log-likelihood ratios (LLRs) for the respective candidates are compared to leave four candidates with the large sums. Assuming that the remaining candidates are 0, 1, 2, and 3, respectively, the three lower-order bits are considered to be determined, and from this, extension by one bit takes place to determine the next-step candidate group. That is, the next candidates are 0, 8(=0+8), 1, 9(=1+8), 2, 10(=2+8), 3, and 11(=3+8), which are eight again in number. This method enables the number of candidates to be managed to be limited to eight and infinite accumulation.

Figure 10:
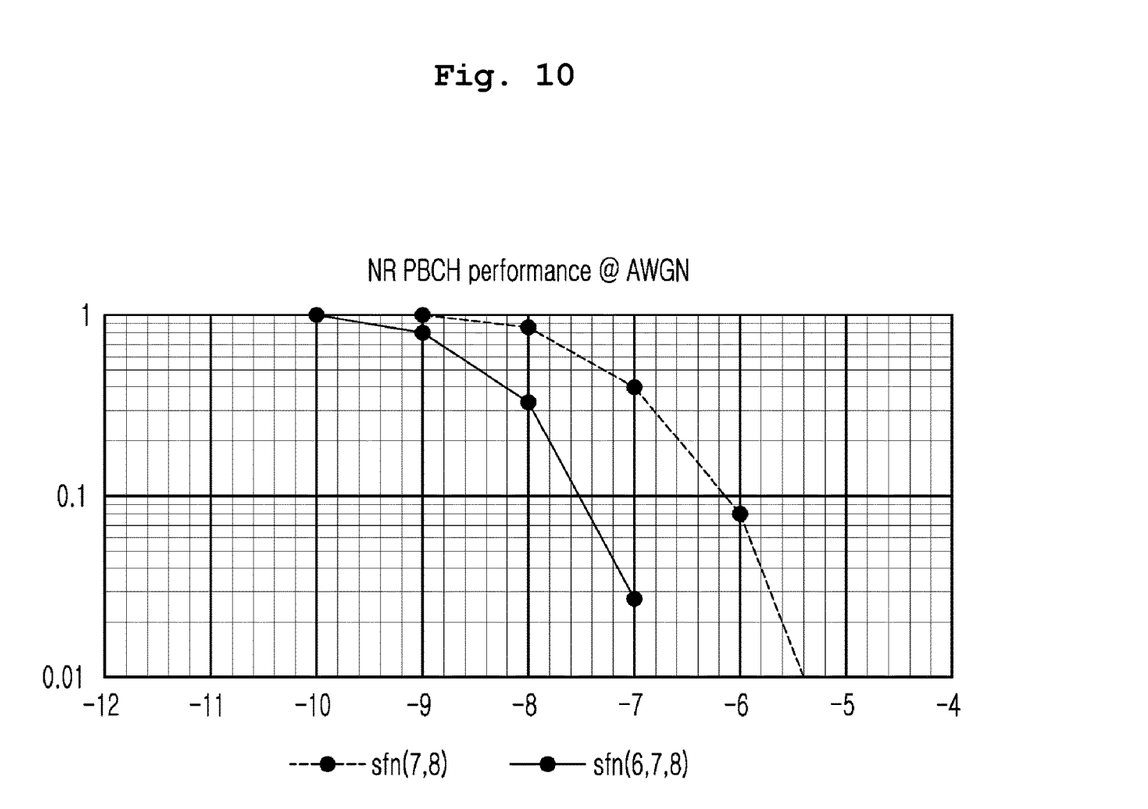
FIG. 10 is a graph illustrating PBCH reception performance comparison between a case of accumulation with respect to only two bits of an SFN and a case of accumulation with respect to a total of three bits to which one bit of the SFN is added according to an embodiment of the present invention.

FIG. 10 is a graph illustrating PBCH reception performance comparison between a case of accumulation with respect to only two bits of an SFN and a case of accumulation with respect to a total of three bits to which one bit of the SFN is added according to an embodiment of the present invention. In the graph, sfn(7,8) refers to a case of accumulation with respect to only two bits of ($sfn_7$, $sfn_8$), and sfn(6,7,8) refers to a case of accumulation with respect to three bits of ($sfn_6$, $sfn_7$, $sfn_8$).

Referring to FIG. 10, comparing the case of using two bits as an inversion vector and the case of using three bits as an inversion vector, it is found that using three bits as the inversion vector provides the performance enhancement by 1.5 dB. Herein, the PBCH signals received at different times are soft-combined using the respective SNRs in a maximal ratio combining (MRC) scheme. The SNR is calculated through the PSS/SSS/DM-RS signal included in the SSB block.

As described above, according to the embodiments, there is provided the accumulation method in which the inversion vector for "negating" the SFN information, which is changed every frame in the PBCH signal, is generated by using the linearity characteristic of the polar code, and then the inversion vector and the received PBCH signal are subjected to modulo addition, so that the SFN information changed with time always has the same value and thus the PBCH signals are accumulated over time. Further, there is provided the PBCH decoder that reconstructs the negated SFN information after signal detection, and thus by accumulating the PBCH signals, the SNR of the signal received by the 5G NR receiver is improved, and the reception performance at the edge of the cell is enhanced.

Further, the above-described example of the PBCH signal accumulation method for enhancing the performance of the 5G NR receiver may be implemented in the form of computer program instructions that are executed through various computer components. Also, the implemented computer program may be recorded on a computer-readable recording medium. Examples of the recording medium include a ROM, a magnetic disk, a compact disk, an optical disk, or the like, but no limitation thereto is imposed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of operating a 5G New Radio (NR) receiver, the method comprising:

receiving at least two frames, each frame including a physical broadcasting channel (PBCH) signal with a system frame number (SFN);
generating an inversion vector for negating the SFN of the received PBCH signal;
performing accumulation on at least two frames by performing modulo addition on the generated inversion vector and the received PBCH signal of each of the at least two frames to generate an accumulated PBCH signal;
decoding the accumulated PBCH signal to generate at least two decoded PBCH signals; and
checking validity of each of the at least two decoded PBCH signals and reconstructing the SFN of each of the at least two decoded PBCH signals,
wherein the checking of the validity of each of the at least two decoded PBCH signals is to determine whether an SFN of each decoded PBCH signal is "0".

2. The method of claim 1,
wherein the inversion vector is a vector for changing the SFN of the received PBCH signal of each of the at least two frames, by using a linearity characteristic of a polar code, to a predetermined value so that after the negating of the SFN of the received PBCH signal, the SFN of the received PBCH signal of each of the at least two frames has the predetermined value.

3. The method of claim 1,
wherein the inversion vector is generated by performing encoding in a polar coding scheme from a payload of the PBCH signal of each of the at least two frames.

4. The method of claim 1,
wherein the reconstructing of the SFN is assigning the SFN included in the received PBCH signal to a corresponding one of the at least two decoded PBCH signal.

5. The method of claim 1,
wherein at the generating of the inversion vector, with respect to at least one combination of the bits to be negated, at least one inversion vector having different SFN start points in time for respective frames is generated for each SFN candidate.

6. The method of claim 5,
wherein at the performing of the accumulation, the accumulation is performed over the at least two frames by performing the modulo addition, for each SFN candidate, on the received PBCH signal and the generated inversion vector.

7. The method of claim 6,
wherein the reconstructing of the SFN includes performing a reverse operation from the candidate corresponding to the inversion vector for the decoded PBCH signal of which the validity is checked.

8. The method of claim 5,
wherein the number of the candidates is reduced by comparing sums of absolute values of the received signals for each candidate every particular point in time.

9. A non-transitory, computer-readable recording medium having a program recorded thereon, the program for executing a method of operating a 5G New Radio (NR) receiver, the method comprising:
receiving at least two frames, each frame including a physical broadcasting channel (PBCH) signal with a system frame number (SFN);
generating an inversion vector for negating the SFN of the received PBCH signal;
performing accumulation on at least two frames by performing modulo addition on the generated inversion vector and the received PBCH signal of each of the at least two frames to generate an accumulated PBCH signal;
decoding the accumulated PBCH signal to generate at least two decoded PBCH signals; and
checking validity of each of the at least two decoded PBCH signals and reconstructing the SFN of each of the at least two decoded PBCH signals,
wherein the checking of the validity of each of the at least two decoded PBCH signals is to determine whether an SFN of each decoded PBCH signal is "0".

10. A method of operating a 5G New Radio (NR) receiver, the method comprising:
receiving at least two frames, each frame including a physical broadcasting channel (PBCH) signal with a system frame number (SFN);
generating an inversion vector for negating the SFN of the received PBCH signal;
performing accumulation on at least two frames by performing modulo addition on the generated inversion vector and the received PBCH signal of each of the at least two frames to generate an accumulated PBCH signal;
decoding the accumulated PBCH signal using a candidate SFN to generate at least two decoded PBCH signals;
determining whether the decoding is successful;
determining, in response to the determining of whether the decoding is successful, an SFN of each of the at least two decoded PBCH signals based on the candidate SFN and a number of the accumulated at least two frames; and
checking validity of each decoded PBCH signal of the at least two decoded PBCH signals,
wherein the checking of the validity of each decoded PBCH signal is to determine whether an SFN of each decoded PBCH signal is "0".

* * * * *